United States Patent
Jin et al.

(10) Patent No.: US 10,938,092 B2
(45) Date of Patent: Mar. 2, 2021

(54) ANTENNA ASSEMBLY

(71) Applicant: Apple Inc., Cupertino, CA (US)

(72) Inventors: Nanbo Jin, San Jose, CA (US); Devon A. Monaco, San Jose, CA (US); Donald J. Parr, Mountain View, CA (US); Erica J. Tong, Pacifica, CA (US); Han Wang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 31 days.

(21) Appl. No.: 16/297,395

(22) Filed: Mar. 8, 2019

(65) Prior Publication Data

US 2020/0083592 A1 Mar. 12, 2020

Related U.S. Application Data

(60) Provisional application No. 62/730,485, filed on Sep. 12, 2018.

(51) Int. Cl.
| | | |
|---|---|---|
| *H01Q 1/24* | (2006.01) | |
| *H05K 1/02* | (2006.01) | |
| *H05K 1/03* | (2006.01) | |
| *H05K 1/18* | (2006.01) | |
| *H01Q 1/22* | (2006.01) | |

(52) U.S. Cl.
CPC ........... *H01Q 1/243* (2013.01); *H01Q 1/2283* (2013.01); *H05K 1/0219* (2013.01); *H05K 1/0298* (2013.01); *H05K 1/0393* (2013.01); *H05K 1/189* (2013.01); *H05K 2201/0715* (2013.01)

(58) Field of Classification Search
CPC ............ H01Q 1/38; H01Q 1/40; H01Q 1/243; H01Q 1/2283; H01Q 13/10
USPC .................................................. 343/702, 841
See application file for complete search history.

(56) References Cited

U.S. PATENT DOCUMENTS

| | | | | |
|---|---|---|---|---|
| 6,215,454 | B1* | 4/2001 | Tran ........................ | H01Q 1/243 343/702 |
| 6,980,173 | B2* | 12/2005 | Man ........................ | H01Q 1/243 343/700 MS |
| 7,764,246 | B2* | 7/2010 | Yu ............................ | H01Q 1/52 343/702 |
| 8,531,342 | B2* | 9/2013 | Sung ........................ | H01Q 1/243 343/702 |
| 9,455,488 | B2* | 9/2016 | Chirila ................. | H01Q 1/2208 |
| 2009/0256758 | A1* | 10/2009 | Schlub ..................... | H01Q 5/40 343/702 |
| 2016/0156098 | A1* | 6/2016 | Kim ........................ | H01Q 1/243 343/841 |

* cited by examiner

*Primary Examiner* — Tung X Le
(74) *Attorney, Agent, or Firm* — Morgan, Lewis & Bockius LLP

(57) ABSTRACT

A disclosed antenna assembly includes a first flexible circuit having a first signal line, at least one first shielding layer, and a first attachment region. The first attachment region includes a first signal pad and first shielding pads disposed around the first signal pad. The antenna assembly further includes a second flexible circuit having a second signal line, at least one second shielding layer, and a second attachment region. The second attachment region includes a second signal pad and second shielding pads disposed around the second signal pad. The first attachment region is attached to the second attachment region.

20 Claims, 13 Drawing Sheets

US 10,938,092 B2

ANTENNA ASSEMBLY

CROSS REFERENCE TO RELATED APPLICATIONS

This application claims the benefit of U.S. Provisional Application No. 62/730,485, entitled "ANTENNA ASSEMBLY," filed Sep. 12, 2018, the entirety of which is incorporated herein by reference.

TECHNICAL FIELD

The present description relates generally to an electronic device, and, more particularly, to an antenna assembly having multiple flexible circuits.

BACKGROUND

Portable electronic devices are known to include a housing and a cover glass that combines with the housing to enclose components such as a circuit board, a display, and a battery. Also, portable electronic devices are known to communicate over a network server to send and receive information, as well as communicate with a network carrier to send and receive voice communication. As portable electronic devices increase in complexity and/or decrease in size, it becomes increasingly challenging to integrate various functional components without unduly degrading their performance or increasing cost.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

Figure 1:
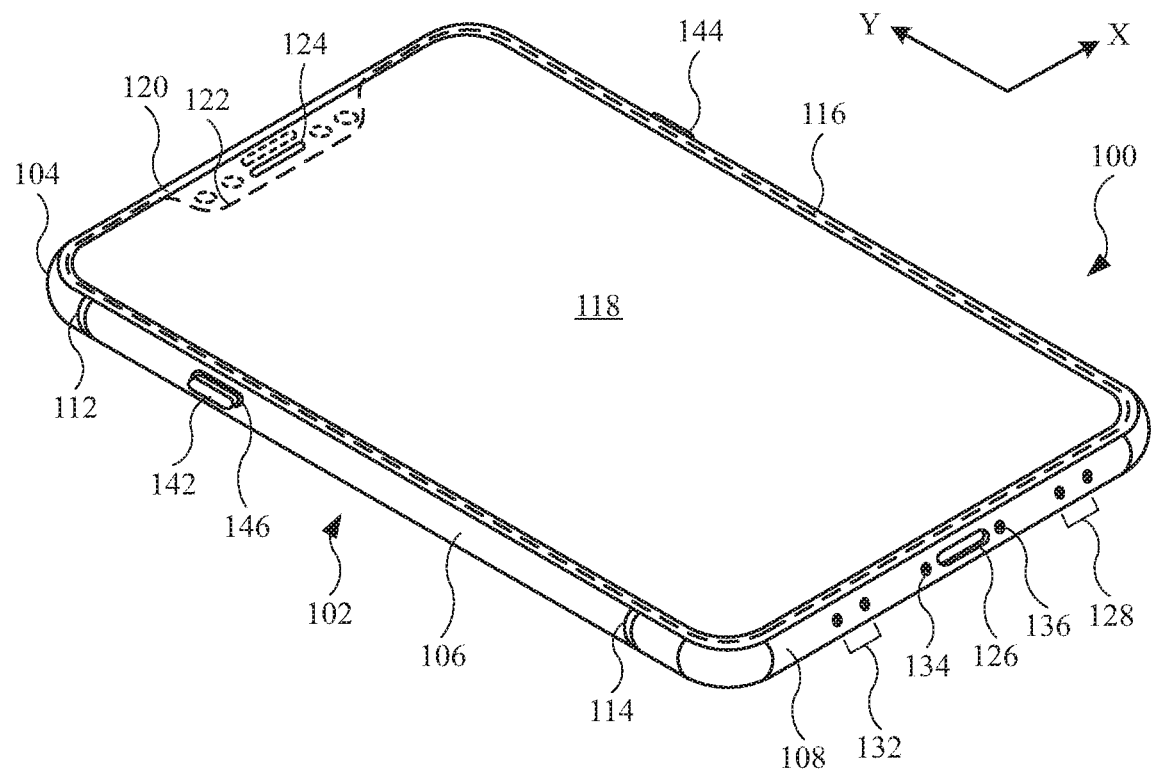
FIG. 1 illustrates a front isometric view of an electronic device, according to some embodiments.

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

BRIEF SUMMARY

Embodiments of the present disclosure include an antenna assembly comprising: a first flexible circuit having a first signal line, at least one first shielding layer, and a first attachment region, wherein the first attachment region includes a first signal pad and first shielding pads disposed around the first signal pad; and a second flexible circuit having a second signal line, at least one second shielding layer, and a second attachment region, the second attachment region including a second signal pad and second shielding pads disposed around the second signal pad, wherein the first attachment region is attached to the second attachment region.

Embodiments of the present disclosure include a flexible circuit for an antenna, the flexible circuit comprising: a conductive signal line; a conductive shielding layer overlapping the conductive signal line; a dielectric layer between the conductive signal line and the conductive shielding layer; two rows of conductive shielding pads electrically connected to the conductive shielding layer; and a row of conductive signal pads electrically connected to the conductive signal line, wherein the row of conductive signal pads is staggered relative to the two rows of conductive shielding pads and the row of conductive signal pads is positioned between the two rows of conductive shielding pads.

Embodiments of the present disclosure include an electronic device comprising: a chassis having a grounding path; electronic components mounted to the chassis; and an antenna assembly mounted to the chassis between two or more of the electronic components, wherein the antenna assembly comprises two flexible circuits attached to each other via a joint, wherein the joint comprises two signal pads bonded to each other and two sets of shielding pads bonded to each other, wherein the two sets of shielding pads are disposed around the two signal pads and are electrically connected to the grounding path of the chassis through at least one of the two flexible circuits.

The following disclosure relates to an electronic device, such as a mobile communication device that takes the form of a smart phone or a tablet computer device. The electronic device may include several enhancements and modifications not found on traditional electronic devices.

According to some embodiments, the electronic device can include an antenna or antenna structure, which can be implemented in a flexible circuit containing a signal line used for transmission of a radiofrequency (RF) signal and/or data signal. The flexible circuit can be manufactured out of a larger panel format substrate that is then singulated into discrete flexible circuits. To provide for improved panelization, for example, the antenna can be implemented as an assembly having multiple flexible circuits attached together. The attachment region of each of the flexible circuits in the assembly can include a pad layout having multiple ground pads disposed around a signal pad. This can, for example, provide for reduced signal loss at the antenna assembly joint. Additionally or alternatively, the antenna joint can include one or more stiffeners and/or a temperature sensitive adhesive to provide for mechanical robustness in the antenna assembly joint. The antenna assembly including multiple attached flexible circuits can be included in an electronic device.

These and other embodiments are discussed below with reference to FIGS. 1-18. However, those skilled in the art will readily appreciate that the detailed description given herein with respect to these Figures is for explanatory purposes only and should not be construed as limiting.

FIG. 1 illustrates a front isometric view of an embodiment of an electronic device 100, in accordance with some described embodiments. The electronic device 100 may house or may otherwise employ an antenna or flexible circuit assembly, as further described herein.

In some embodiments, the electronic device 100 is a tablet computer device. In the embodiment shown in FIG. 1, the electronic device 100 is a mobile wireless communication device (a smartphone, for example). The electronic device 100 may include a band 102 that defines an outer perimeter of the electronic device 100. The band 102 may include a metal, such as aluminum, stainless steel, or an alloy that includes at least one of aluminum or stainless steel. The band 102 may be composed of several sidewall components, such as a first sidewall component 104, a second sidewall component 106, a third sidewall component 108 (opposite the first sidewall component 104), and a fourth sidewall component (not shown in FIG. 1). The aforementioned sidewall components may include any material(s) previously described for the band 102.

In some instances, any one or more of the sidewall components can form part of an antenna assembly (e.g., together with other internal components such as flexible circuits not shown in FIG. 1). As a result, a non-metal material, or materials, may separate the sidewall components of the band 102 from each other in order to electrically isolate the sidewall components. For example, a first composite material 112 separates the first sidewall component 104 from the second sidewall component 106, and a second composite material 114 separates the second sidewall component 106 from the third sidewall component 108. The aforementioned composite may include an electrically inert, or insulating, material(s), such as plastics and/or resin, as non-limiting examples.

In some embodiments, the electronic device 100 may further include a display assembly 116 (shown as a dotted line) that is covered by a first protective cover 118 (hereinafter "front protective cover 118"). The display assembly 116 may include multiple layers, with each layer providing a unique function. The display assembly 116 may be partially covered by a border 120, or frame, that extends along an outer edge of the front protective cover 118 and partially covers an outer edge of the display assembly 116. The border 120 can be positioned to hide or obscure any electrical and mechanical connections between the layers of the display assembly 116 and flexible circuit connectors. Also, in some embodiments the border 120 may include a uniform thickness. For example, the border 120 may include a thickness that generally does not change in the X- and Y-dimensions. In other embodiments, the border 120 may include a non-uniform thickness that changes in the X- and/or Y-dimensions.

Also, as shown in FIG. 1, in some embodiments the display assembly 116 may include a notch 122, representing an absence of the display assembly 116. The notch 122 may allow for a vision system that provides the electronic device 100 with information for object recognition, such as facial recognition. In this regard, the electronic device 100 may include a masking layer with openings (shown as dotted lines) designed to hide or obscure the vision system, while the openings allow the vision system provide the object recognition information. Also, the front protective cover 118 may be formed from a transparent material, such as glass, plastic, sapphire, or the like. In this regard, the front protective cover 118 may be referred to as a transparent cover, a transparent protective cover, or a cover glass (when the front protective cover 118 includes glass). As shown in FIG. 1, the front protective cover 118 includes a cover opening 124, which may represent a single opening of the front protective cover 118. The cover opening 124 may allow for transmission of acoustical energy (in the form of audible sound) into the electronic device 100, which may be received by a microphone (not shown in FIG. 1) of the electronic device 100. Further, the cover opening 124 may allow for transmission of acoustical energy (in the form of audible sound) out the electronic device 100, which may be generated by an audio module (not shown in FIG. 1) of the electronic device 100. Also, some embodiments of the electronic device 100 may avoid a need for a discrete mechanical button, such as a "home button," commonly found in electronic devices, as the front protective cover 118 can be configured without additional openings. Alternatively, other embodiments may include a home button and/or additional openings in the front protective cover 118, or button functionality may be provided using touch-sensitive functionality, for example.

In some embodiments, the electronic device 100 may further include a port 126 designed to receive a connector of a cable assembly. The port 126 can be configured for exchange of data and/or power signals. For example, the port 126 may allow the electronic device 100 to communicate data information (send and/or receive), and the port 126 may also allow the electronic device 100 to receive electrical energy to charge a battery assembly (not shown in FIG. 1). Accordingly, the port 126 may include terminals (not shown in FIG. 1) that electrically couple to the connector.

Also, in some embodiments the electronic device 100 may include one or several openings. For example, the electronic device 100 may include one or more first sidewall openings 128 that allow an additional audio module (not shown in FIG. 1) of the electronic device to emit acoustical energy out of the electronic device 100. The electronic device 100 may further include one or more second sidewall openings 132 that allow an additional microphone (not shown in FIG. 1) of the electronic device to receive acoustical energy. Also, the electronic device 100 may include a first fastener 134 and a second fastener 136 designed to secure with a rail (not shown in FIG. 1) that is coupled to the front protective cover 118. In this regard, the first fastener 134 and the second fastener 136 are designed to couple the front protective cover 118 with the band 102.

With continued reference to FIG. 1, in some embodiments the electronic device 100 may include one or several control inputs designed to provide a command to the electronic device 100. For example, the electronic device 100 may include a first control input 142 and a second control input 144. The aforementioned control inputs may be used to adjust the visual information presented on the display assembly 116 or the volume of acoustical energy output by an audio module, as non-limiting examples. The control inputs may include one of a switch or a button designed to generate a command to a processor circuit (not shown in FIG. 1). The control inputs may at least partially extend through openings in the sidewall components. For example, the second sidewall component 106 may include a third sidewall opening 146 that receives the first control input 142.

Figure 2:
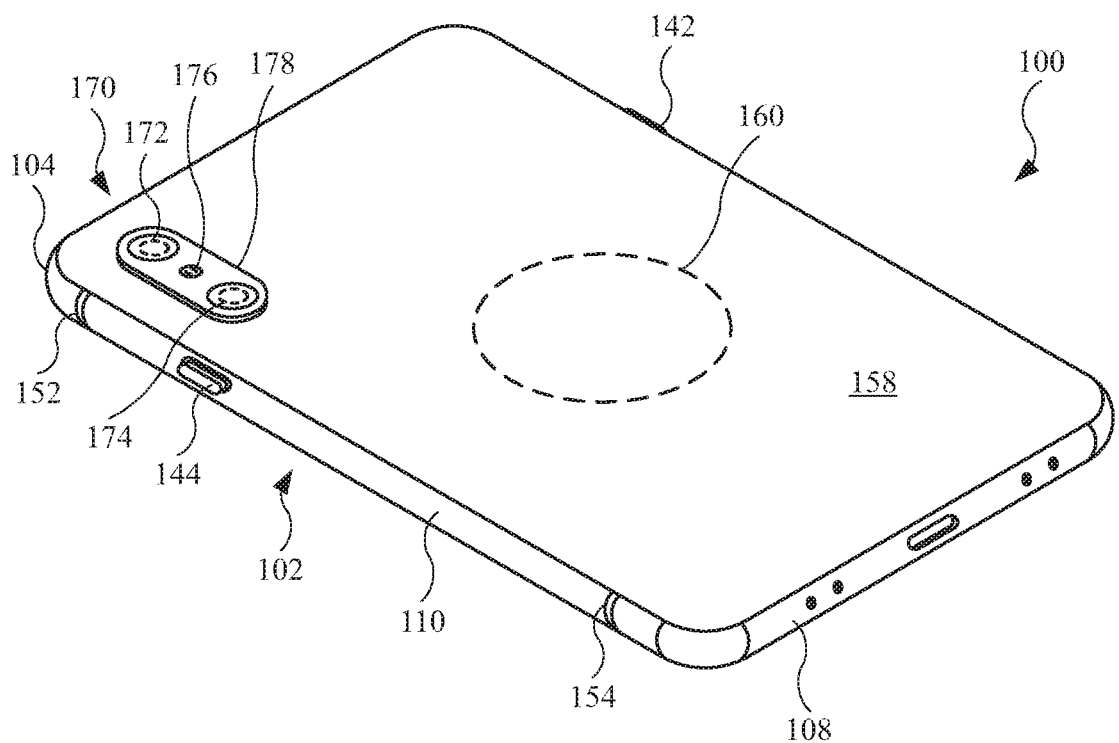
FIG. 2 illustrates a rear isometric view of an electronic device, according to some embodiments.

FIG. 2 illustrates a rear isometric view of the electronic device 100 shown in FIG. 1, according to some embodiments. In addition to the aforementioned sidewall components, the band 102 may further include a fourth sidewall component 110. As shown, a third composite material 152 separates the first sidewall component 104 from the fourth sidewall component 110, and a fourth composite material 154 separates the fourth sidewall component 110 from the third sidewall component 108.

In some embodiments, the electronic device 100 may further include a second protective cover 158 (hereinafter "back protective cover 158") that couples with the band 102. In this regard, the back protective cover 158 may combine with the band 102 to form an enclosure of the electronic device 100, with the enclosure (band 102 and back protective cover 158) defining an internal volume that carries several internal components, such as a battery assembly, circuit board assembly, vision system, as non-limiting examples. The back protective cover 158 may include any material(s) previously described for the front protective cover 118 (shown in FIG. 1). When the back protective cover 158 includes a non-metal material, the electronic device 100 may provide hardware (and software) to support wireless charging. For example, the electronic device 100 may include a wireless power receiving module 160 (represented by a dotted line) covered by the back protective cover 158. The wireless power receiving module 160 is designed to receive an induced current when exposed to an alternating electromagnetic field. Also, the front protective cover 118 (shown in FIG. 1) is referred to herein as a "front" protective cover and the back protective cover 158 is referred to as a "back" protective cover, as the front of the electronic device 100 can be generally associated with the display assembly 116 (which is covered by the front protective cover 118), and the back of the electronic device 100 can be generally associated with a back wall, such as the back protective cover 158. Other configurations are contemplated in which the electronic device 100 employs flexible displays, foldable displays, wrap-around displays, or the like.

In some embodiments, the electronic device 100 may further include a camera assembly 170, which may include a dual camera assembly. As shown, the camera assembly 170 may include a first camera module 172, a second camera module 174, and a light emitter 176 positioned between the first camera module 172 and the second camera module 174. The light emitter 176 is designed to provide additional lighting during an image capture event by the first camera module 172 and/or the second camera module 174. Also, in some embodiments the camera assembly 170 may further include a camera protective cover 178 formed from a transparent material that covers the first camera module 172, the second camera module 174, and/or the light emitter 176. In some embodiments, the camera protective cover 178 may include a masking layer (not shown in FIG. 2) designed to at least partially obscure part of the camera protective cover 178, the first camera module 172, the second camera module 174, and/or the light emitter 176. The masking layer includes openings that allow the first camera module 172 and the second camera module 174 to capture images, and that allow the light emitter 176 to emit light that exits the electronic device 100. Also, as shown in FIG. 2, the first camera module 172 and the second camera module 174 may be aligned (collectively) in a manner that is parallel with respect to the second sidewall component 106 (shown in FIG. 1) and the fourth sidewall component 110. In other words, an imaginary line can be drawn through the first camera module 172 and the second camera module 174 that is parallel with respect the second sidewall component 106 (shown in FIG. 1) and the fourth sidewall component 110. Other configurations are contemplated, such as embodiments in which the camera assembly 170 is aligned (collectively) in a manner that is parallel with respect to the first sidewall component 104 and third sidewall component 108. Further, although a dual camera assembly is shown, it is contemplated that the camera assembly 170 can alternatively be configured as a single camera, triple camera, or any other suitable type of camera assembly.

Figure 3:
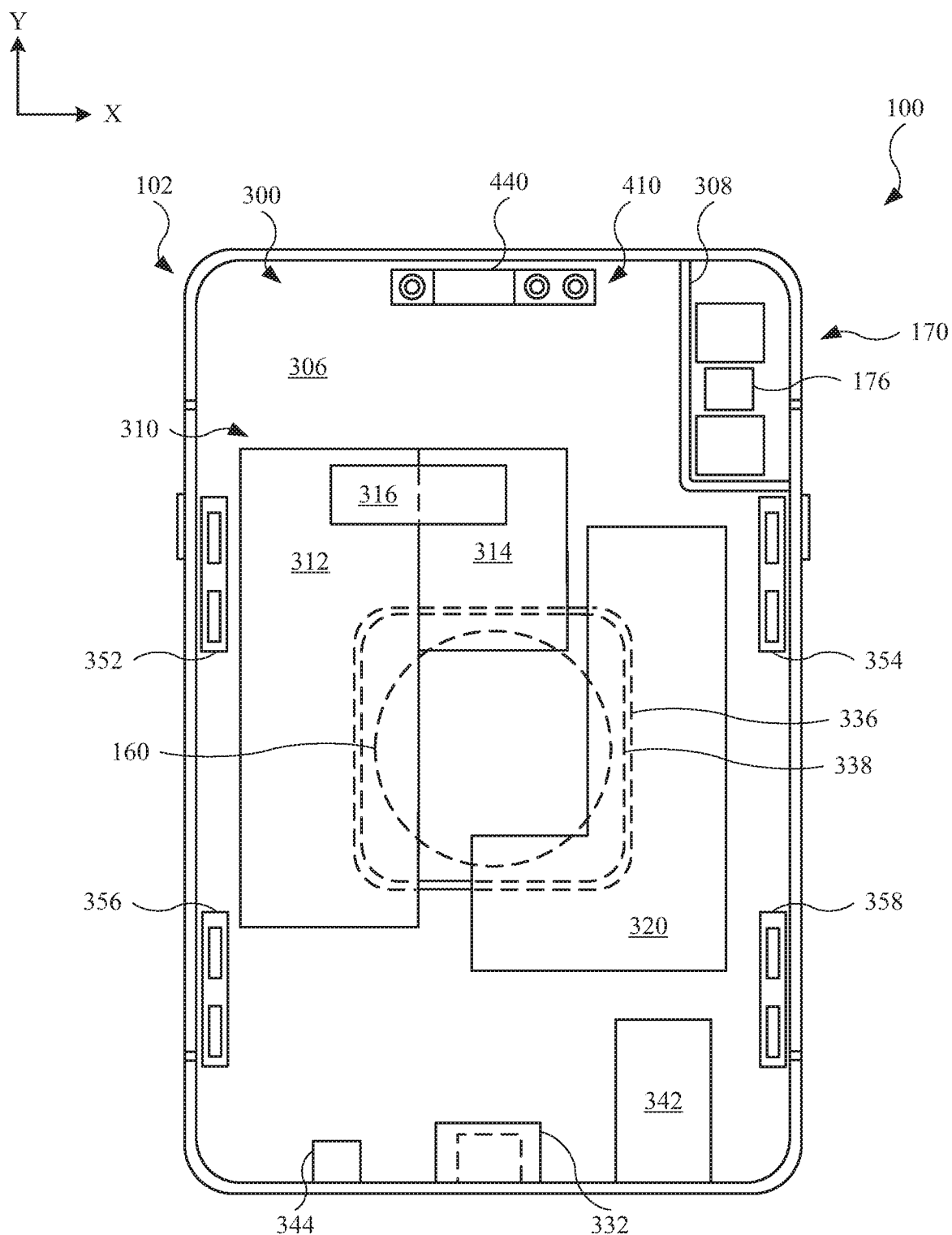
FIG. 3 illustrates a plan view of an electronic device, according to some embodiments.

FIG. 3 illustrates a plan view of the electronic device 100 shown in FIG. 1, according to some embodiments. The electronic device 100 is shown in FIG. 3 with the display assembly 116 and the front protective cover 118 removed to illustrate an example of a layout of several components that can be included in an internal volume of the electronic device 100. For purposes of simplicity and illustration, some electrical connections, such as flexible circuits, wires, cables, etc., between internal components are removed. According to some embodiments, an antenna as described herein can be laid out substantially anywhere in the electronic device 100. As further described below, the antenna can be configured as an assembly of flexible circuits that can be laid out between and/or around various internal components such as those shown in FIG. 3. The antenna assembly can further include shielding features to mitigate electrical interference between the antenna and other internal components and/or provide signal containment within the antenna assembly.

As shown in FIG. 3, in some embodiments the electronic device 100 may include a vision system 410 and a bracket assembly 440 used to carry the vision system 410. The vision system 410 may provide the electronic device 100 with information related to object recognition, including facial recognition. As shown in FIG. 3, the bracket assembly 440 can be designed to maintain a fixed distance between the optical components of the vision system 410.

The electronic device 100 may further include a chassis 306 that provides structural support. The chassis 306 may include a rigid material, such as a metal. In this manner, the chassis 306 may provide a structure or framework onto which various components, such as an antenna assembly and/or other components, can be mounted and assembled. Also, the chassis 306 may include a conductive material coupled to the band 102. In this manner, the chassis 306 may also provide an electrical grounding path for components electrically coupled to the chassis. Also, in some embodiments the chassis 306 may include a wall 308. The wall 308 may combine with the band 102 to surround the camera assembly 170. The wall 308 may also limit or prevent light generated from the light emitter 176 from further entering the internal volume 300.

According to some embodiments, the electronic device 100 may further include a battery assembly 310 that includes a first battery component 312 coupled with a second battery component 314 by coupling member 316. The coupling member 316 may include an adhesive material. Both the first battery component 312 and the second battery component 314 are designed to generate electrical energy that can be used by several aforementioned components in the internal volume 300 and/or an antenna as further described below. Also, as shown in FIG. 3, the battery assembly 310 resembles an L-shape, based upon the combined shape of the first battery component 312 and the second battery component 314. Although the battery assembly 310 is shown with an L-shaped configuration and multiple battery components coupled by coupling member 316, in various embodiments the battery assembly 310 may include any other suitable shape, include only a single battery component, or include more than two battery components coupled together, for example.

The shape of the battery assembly 310 may accommodate other components. For example, the electronic device 100 may further include a circuit board assembly 320. The circuit board assembly 320 may include at least two circuit boards in a stacked configuration. The stacked configuration may conserve space in the internal volume 300, particularly in least one of the X- and Y-dimensions, X- and Y-dimensions (as well as a Z-dimension, discussed later) referring to Cartesian coordinates. The circuit board assembly 320 may include several active components (such as integrated circuits) that provide the primary processing for the electronic device 100. Also, similar to the battery assembly 310, the circuit board assembly 320 may resemble an L-shape. In this manner, both the battery assembly 310 and the circuit board assembly 320 can be shaped to conserve space in the internal volume 300. Although the circuit board assembly 320 is shown with an L-shaped configuration, and a stacked configuration of at least two circuit boards is described, in various embodiments the circuit board assembly 320 may include any other suitable shape or include only a single circuit board, for example.

With continued reference to FIG. 3, in some embodiments the electronic device 100 may further include a dock 332 in a location corresponding to the port 126 (shown in FIG. 1). The dock 332 may include terminals and other electrical connection points (not shown). The dock 332, in conjunction with the port 126, can receive a connector (used with a cable assembly), thereby allowing the electronic device to send and receive data transmission. Also, the dock 332 can receive electrical energy used to recharge the battery assembly 310.

In some embodiments, the electronic device 100 may further include a wireless power receiving module 160 designed to provide electrical energy to the battery assembly 310. The wireless power receiving module 160 may include a receiver coil designed to receive an induced current by an alternating electromagnetic field generated by a transmitter coil that is external with respect to the electronic device 100. Also, the chassis 306 may include a chassis opening 336 (defined by a void in the chassis 306) such that the chassis 306 does not impede the alternating electromagnetic field. Also, the wireless power receiving module 160 may include a shielding element 338 designed to shield at least some components in the internal volume 300 from the alternating electromagnetic field.

In some embodiments, the electronic device 100 may further include an audio module 342 designed to generate acoustical energy in the form of audible sound. The electronic device 100 may further include a microphone 344 designed to receive acoustical energy. Also, the electronic device may further include several rail clips designed to receive rails secured to the front protective cover 118 (shown in FIG. 1). For example, the electronic device 100 may include a first rail clip 352, a second rail clip 354, a third rail clip 356, and a fourth rail clip 358.

Figure 4:
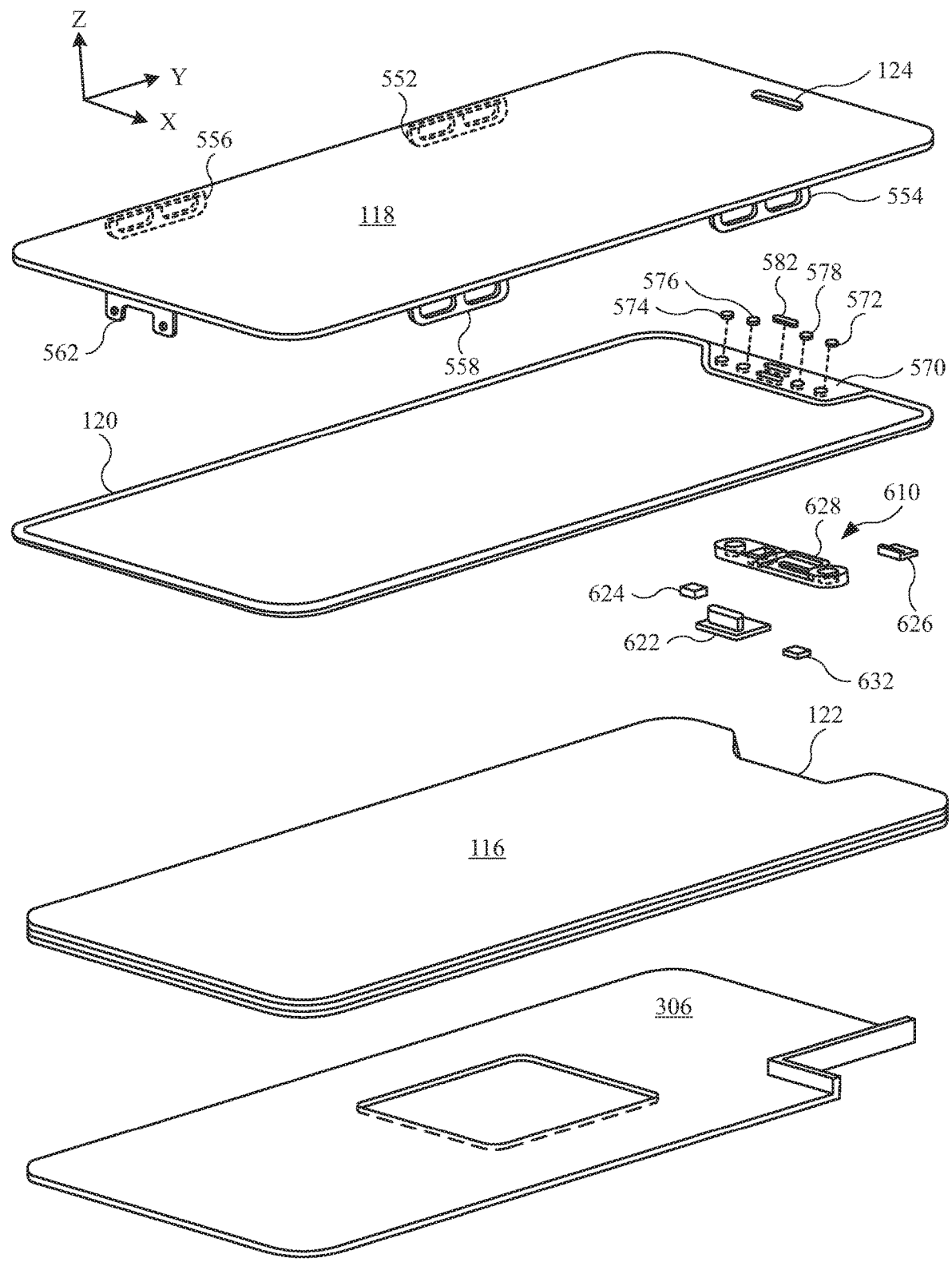
FIG. 4 illustrates an exploded view of an electronic device, according to some embodiments.

FIG. 4 illustrates an exploded view of the electronic device 100, according to some embodiments. FIG. 4 illustrates the front protective cover 118, the display assembly 116, and the chassis 306, as well as several additional components of the electronic device 100 (shown in FIG. 1). According to some embodiments, various internal components such as an antenna, a flexible circuit assembly, the battery assembly 310, the circuit board assembly 320, and/or other electronic components may be mounted to the chassis 306 and assembled in an internal volume between the chassis 306 and the display assembly 116.

As shown in FIG. 4, in some embodiments the front protective cover 118 may include several rails designed to secure the front protective cover 118. For example, the front protective cover 118 may include a first rail 552, a second rail 554, a third rail 556, and a fourth rail 558 designed to couple with the first rail clip 352, a second rail clip 354, a third rail clip 356, and a fourth rail clip 358, respectively (shown in FIG. 3). Also, the front protective cover 118 may further include a fifth rail 562 designed to receive the first fastener 134 and the second fastener 136 (shown in FIG. 1).

In some embodiments, the border 120 may secure with a surface (such as an internal surface) of the front protective cover 118. In addition to the border 120 hiding or obscuring electrical and mechanical connections to the display assembly 116, additional layers may be used to hide or obscure some features. For example, the electronic device 100 may include a masking layer 570 designed to at least partially hide or obscure the vision system 410 and the bracket assembly 440. The masking layer 570 may include an opaque material designed to block light, including visible light, UV light, and IR light. The opaque material may include an ink material that is adhered to a surface of the front protective cover 118. Also, the masking layer 570 may include an appearance, in terms of color and reflectivity, designed to match that of the border 120. For example, when the border 120 includes a black or white appearance (as non-limiting examples), the masking layer 570 may include a black or white appearance, respectively.

In order to allow the vision system 410 to provide object recognition, the masking layer 570 may include several openings (not labeled). However, at least some of the openings may be covered or filled by a material that is semi-opaque. For example, an electronic device described herein may include a first layer 572 that covers a first opening of the masking layer 570, a second layer 574 that covers an additional second opening of the masking layer 570, and a third layer 576 that covers an additional third opening of the masking layer 570. In some embodiments, the first layer 572, the second layer 574, and the third layer 576 include an appearance, in terms of color and/or reflectivity, similar to that of the masking layer 570 (and accordingly, an appearance, in terms of color and/or reflectivity, similar to that of the border 120). However, the first layer 572, the second layer 574, and the third layer 576 may be designed to filter out some light in some frequencies while selectively transmitting light in other frequencies. For example, the first layer 572, the second layer 574, and the third layer 576 may block visible light (as well as other light), and allow IR light to permeate. As a result, the first layer 572, the second layer 574, and the third layer 576 may be referred to as visible light filters. The first layer 572, the second layer 574, and the third layer 576 may cover components of the vision system 410 designed to transmit/emit IR light or receive IR light. A light module 624 may also be aligned with a visible light filter.

Further, the electronic device 100 may include a fourth layer 578 that covers an additional fourth opening of the masking layer 570, and a fifth layer 582 that covers an additional fifth opening of the masking layer 570. In some embodiments, the fourth layer 578 and the fifth layer 582 include an appearance, in terms of color and/or reflectivity, similar to that of the masking layer 570 (and accordingly, an appearance, in terms of color and/or reflectivity, similar to that of the border 120). However, the fourth layer 578 and the fifth layer 582 may be designed to filter out some light in some frequencies while selectively transmitting light in other frequencies. For example, the fourth layer 578 and the fifth layer 582 may block IR light (as well as other light), and allow visible light to permeate. As a result, the fourth layer 578 and the fifth layer 582 may be referred to as IR light filters. The fourth layer 578 and the fifth layer 582 may cover components of the vision system 410 designed to receive visible light. An ambient light sensor 626 may also be aligned with an IR light filter.

In some instances, the bracket assembly 440 and the vision system 410 are not affixed in the electronic device 100 (shown in FIG. 1). Rather, the bracket assembly 440 (along with the vision system 410) may be placed in the internal volume 300 and allowed to generally move freely with respect to, for example, the chassis 306 and the band 102. However, as the front protective cover 118 is coupled with the band 102 (by way of the rails securing with the rail clips), the position of the bracket assembly 440 and the vision system 410 can be adjusted to a desired location in the internal volume 300, and compressive forces can retain the bracket assembly 440 and the vision system 410 in a desired location.

In some embodiments, the electronic device 100 may include an alignment module 610 that is coupled with the front protective cover 118. In some instances, the masking layer 570, along with the light filter layers described above, is positioned between the front protective cover 118 and the alignment module 610. The alignment module 610 may be coupled with the front protective cover 118 in a location such when the front protective cover 118 is assembled with the enclosure (or with the remaining portion of an electronic device), the alignment module 610 guides the modules of the vision system 410 such that the modules align with a desired light filter layer described above.

In some embodiments, the electronic device 100 may further include an audio module 622 designed to generate acoustical energy. The audio module 622 may be seated on the alignment module 610 such that the audio module 622 is aligned with the cover opening 124 of the front protective cover 118. An electronic device described herein may further include a light module 624 designed to generate light, such as IR light. The light module 624 may be used in conjunction with the vision system 410. For example, the light module 624 may provide additional IR light under conditions of relatively low light. The alignment module 610 may align the light module 624. The electronic device 100 may further include an ambient light sensor 626 designed to detect an amount of light external with respect to the electronic device. In some instances, the ambient light sensor 626 provides light conditions (such as low-light conditions) that can be used to activate the light module 624. The alignment module 610 may include a rail 628 used to align the ambient light sensor 626. Also, the electronic device 100 may further include a microphone 632 designed to receive acoustical energy. The microphone 632 may be at least partially aligned with the cover opening 124 of the front protective cover 118.

The notch 122 (in the display assembly 116) can be used to accommodate the alignment module 610, as well as the vision system 410. Also, the chassis 306 may be positioned below the display assembly 116 (in the Z-dimension). Accordingly, the chassis 306 may provide support to the display assembly 116 as well as other components.

Electronic devices such as the electronic device 100 may utilize antenna systems for carrying radio frequency (RF), WiFi, and/or other signals. Multiple antennae are often implemented in electronic devices. Some antennas are made from coaxial cables, which are typically are loose inside the electronic device. However, such coaxial cable configurations may be undesirable for portable electronic devices, such as those where mechanical robustness and/or space constraints are important considerations.

According to some embodiments described herein, an antenna may be made at least in part from a flexible circuit or multiple flexible circuits attached or bonded together. Such flexible circuits can, for example, be implemented as liquid crystal polymer (LCP) flexible circuits. Alternatively, any other suitable materials may be used for the flexible circuits. The flexible circuit construction for the antenna may permit mechanically robust mounting and assembly within a portable electronic device, such as the electronic device 100. According to some embodiments, and as further described below, such a flexible circuit antenna can also support proper cable insulation while reducing the space required to produce an insulated cable, saving space within the device while allowing for flush connection and traversal through the electronic device.

Figure 5:
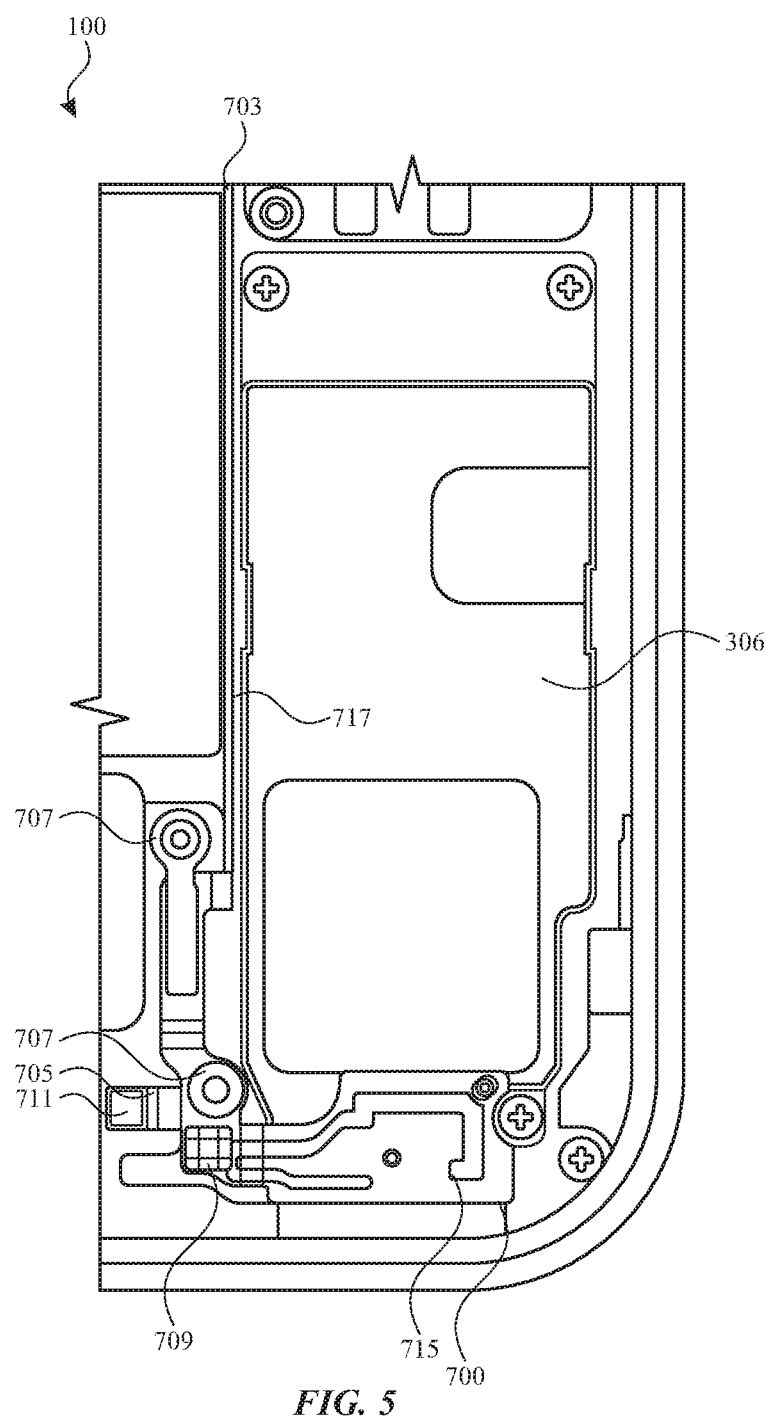
FIG. 5 illustrates a plan view of an electronic device having an antenna mounted to a chassis, according to some embodiments.
Figure 6:
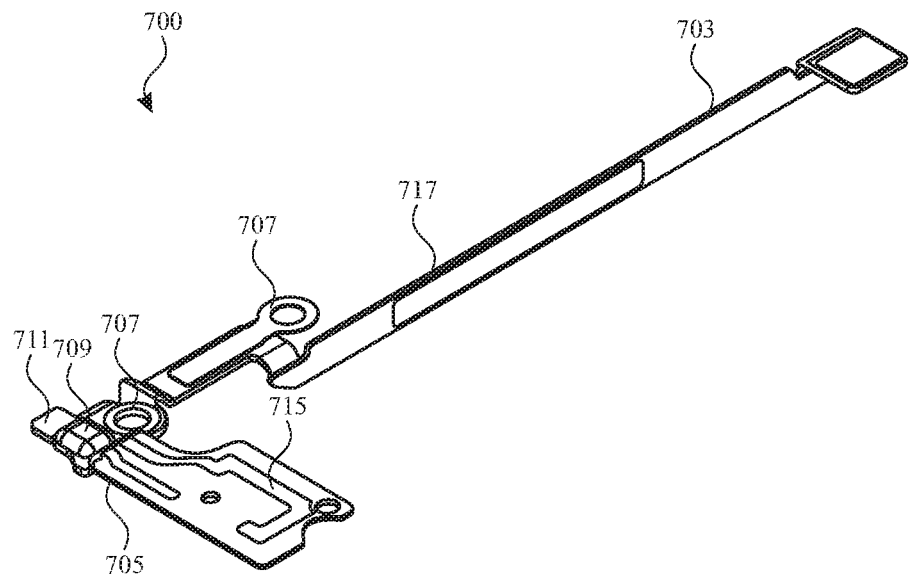
FIG. 6 illustrates an isometric view of an antenna, according to some embodiments.

FIG. 5 shows an example of an antenna 700 mounted in the electronic device 100, according to some embodiments. FIG. 6 shows an example of the antenna 700 itself, while FIG. 7 shows an example of the chassis 306 of the electronic device 100 to which the antenna 700 can connect.

As shown in FIGS. 5 and 6, the antenna 700 can include a flexible circuit 717 mounted to the chassis 306. The antenna can be alternatively referred to as "an RF flex" when implemented in a flexible circuit. The flexible circuit 717 can include a metallic flexible structure that permits multiple signals to be carried therethrough. FIGS. 5 and 6 show an example of in which the antenna 700 comprises a receiving end 703 and a processing end 705, and the signals may be transferred through the antenna 700 from the receiving end 703 to the processing end 705. The processing end 705 is shown as including integrated tuning components 709 and a connector 711 for exchanging signals, power, and/or data with the electronic device 100 or components of the electronic device 100. The antenna 700 may further include integrated antenna traces 715. The integrated antenna traces 715 may be conductive traces that include one or more signal transmission lines and/or shielding layers as further described herein, which may be formed from one or more patterned conductive layers of the flexible circuit 717.

As seen in FIGS. 5 and 6, the antenna 700 can be mounted to the chassis 306 at least in part via clips 707 (alternatively referred to as "tie ins"), any one or more of which can be used to connect part of the antenna 700 to a system ground or a grounding path in the chassis 306. Additionally or alternatively, any one or more of the clips 707 can be used to mechanically secure the flexible circuit 717 to the chassis 306. The antenna 700 can further be communicatively connected to other electronic components in the electronic device 100 via a connector 711, which is configured to removably connect to the chassis 306. In some embodiments, the antenna 700 can be connected via a single connector at the processing end 705 rather than multiple connectors. In other embodiments, multiple connectors may be included in the antenna 700.

Figure 7:
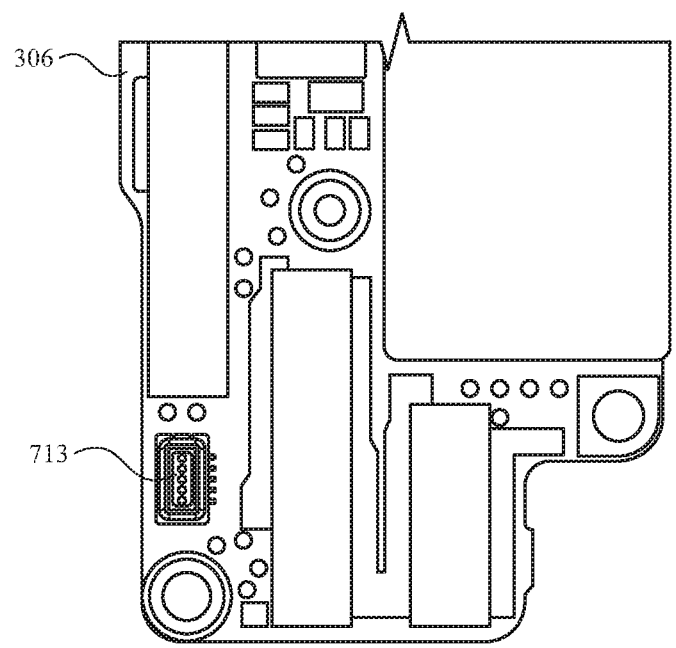
FIG. 7 illustrates a plan view of a chassis, according to some embodiments.

FIG. 7 shows a connector 713 of the chassis 306 to which the connector 711 of the antenna 700 at the processing end 705 is configured to removably connect. As seen in the figure, the connector 713 of the chassis 306 can provide a port or socket that interfaces with the connector 711 of the antenna 700. The connector 711 of the antenna 700 and the connector 713 of the chassis 306 may each be an "MLC" connector (e.g., a connector utilizing a single row) or an "MLD" connector (e.g., a connector utilizing a dual row).

Figure 8:
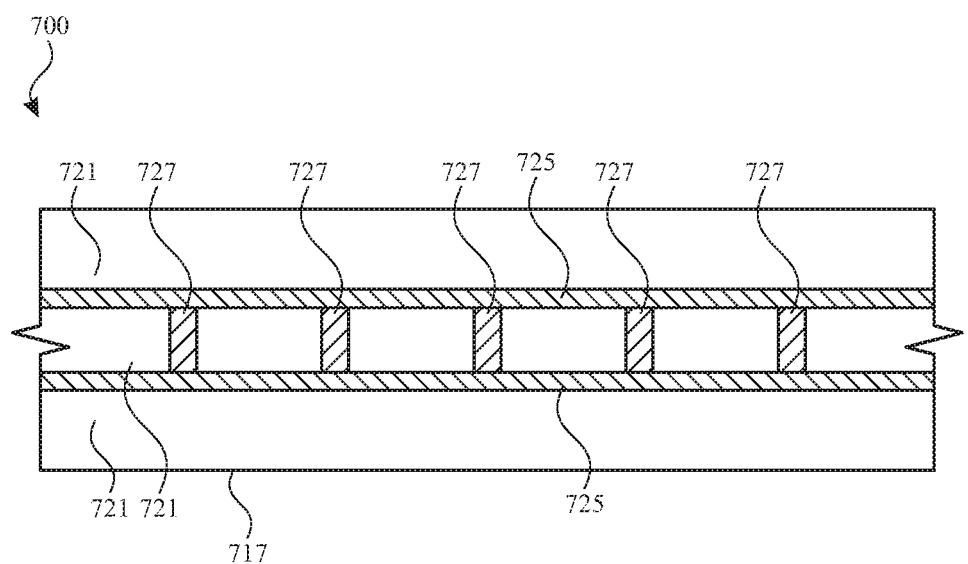
FIG. 8 illustrates a side view of a flexible circuit of an antenna, according to some embodiments.
Figure 9:
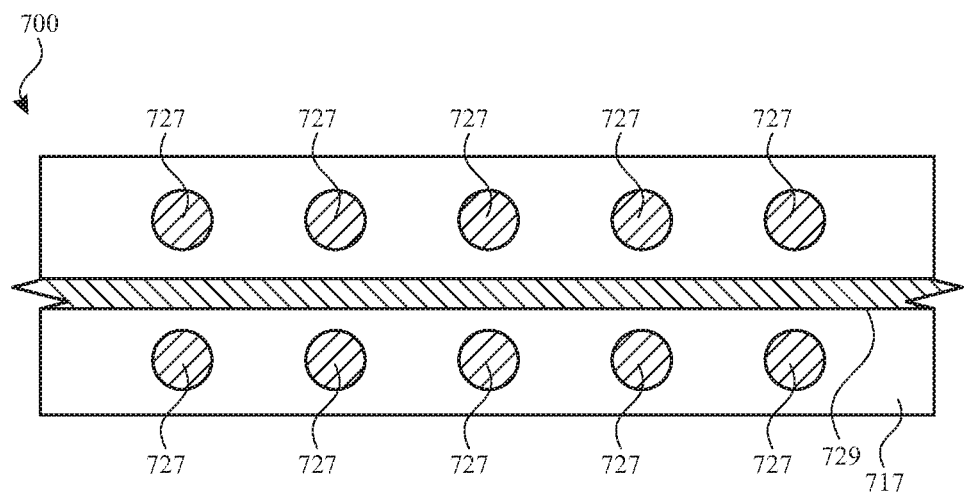
FIG. 9 illustrates a top view of a flexible circuit of an antenna, according to some embodiments.

FIGS. 8 and 9 show an example of antenna 700 using a flexible circuit 717, in side view and top view, respectively. The flexible circuit 717 can be configured as a multilayer flexible circuit having multiple dielectric layers 721, which can support or separate multiple metal layers or other conductive layers. The conductive layers can be patterned to support an antenna system. For example, as shown in FIG. 9, one or more conductive layers of the flexible circuit 717 can include a signal transmission line 729 (also referred to herein as a "signal line" or "transmission line"), which can be used for carrying an RF signal or data signal. As shown in FIG. 8, one or more conductive layers of the flexible circuit 717 can also include one or more shielding layers 725, which can be connected to ground or configured connect to ground. For example, the shielding layer(s) 725 may be routed through the flexible circuit 717 and connected through the flexible circuit 717 to one or more ground pins of a connector of the flexible circuit (e.g., connector 711) that is used to connect the flexible circuit 717 to other components within the electronic device 100. Each of the shielding layer(s) 725 may be arranged to overlap the signal line 729 (e.g., in a plane above or below the signal line 729 in an overlapping area of the flexible circuit).

When assembled in the electronic device 100, the shielding layer(s) 725 can be connected to a system ground plane or other equivalent potential in the electronic device 100 (e.g., via clips 707 and/or connector 711). The flexible circuit 717 can include, for example, three or more stacked layers in which the signal line 729 is disposed in an intermediate conductive layer, with multiple shielding layers included on opposing sides of the intermediate conductive layer. For example, the flexible circuit 717 can include a first shielding layer disposed in a layer above the signal line and a second shielding layer disposed in a layer below the signal line. FIG. 8 shows such a configuration in which two shielding layers are visible on upper and lower layers of the flexible circuit 717, respectively. Signal line 729 is not visible in FIG. 8, but can be disposed in an intervening or intermediate conductive layer between the two planes of the two shielding layers illustrated in FIG. 8. Although a particular arrangement is shown that includes two shielding layers arranged in two respective planes of the flexible circuit 717, various embodiments may use more or fewer shielding layers. Further, it is contemplated that shielding layer(s) may be provided using discrete sheets or coatings on an exterior of the flexible circuit, instead of or in addition to shielding layer(s) formed within the conductive layers of the flexible circuit 717.

As shown in FIGS. 8 and 9, the flexible circuit 717 can further include multiple shielding vias 727. As seen in FIG. 9, the shielding vias 727 may be positioned in an area outside of or positioned to surround the signal line 729 to act like a faraday cage and reduce signal loss. FIG. 9 shows an example in which two rows of shielding vias 727 are positioned on opposing sides of the signal line 729, so that the signal line 729 is positioned between the two rows of shielding vias 727. The shielding vias 727 can be further connected to ground or a grounding path of the chassis 306 (see, e.g., FIG. 5) through the flexible circuit 717. For example, as seen in FIG. 8, the shielding vias 727 can be connected to one or more of the shielding layer(s) 725.

Figure 10:
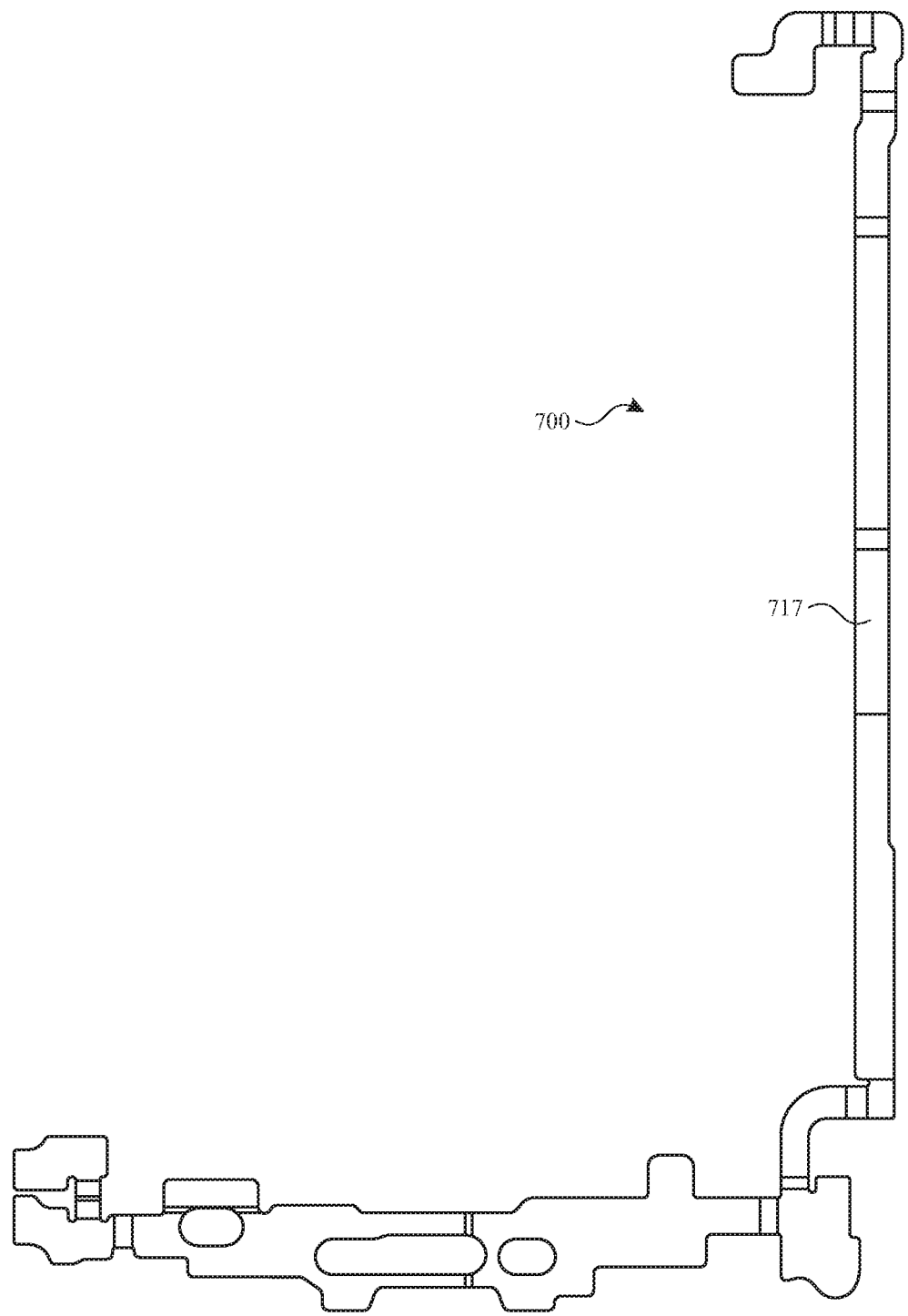
FIG. 10 illustrates a plan view of an antenna in an unfolded configuration, according to some embodiments.
Figure 11:
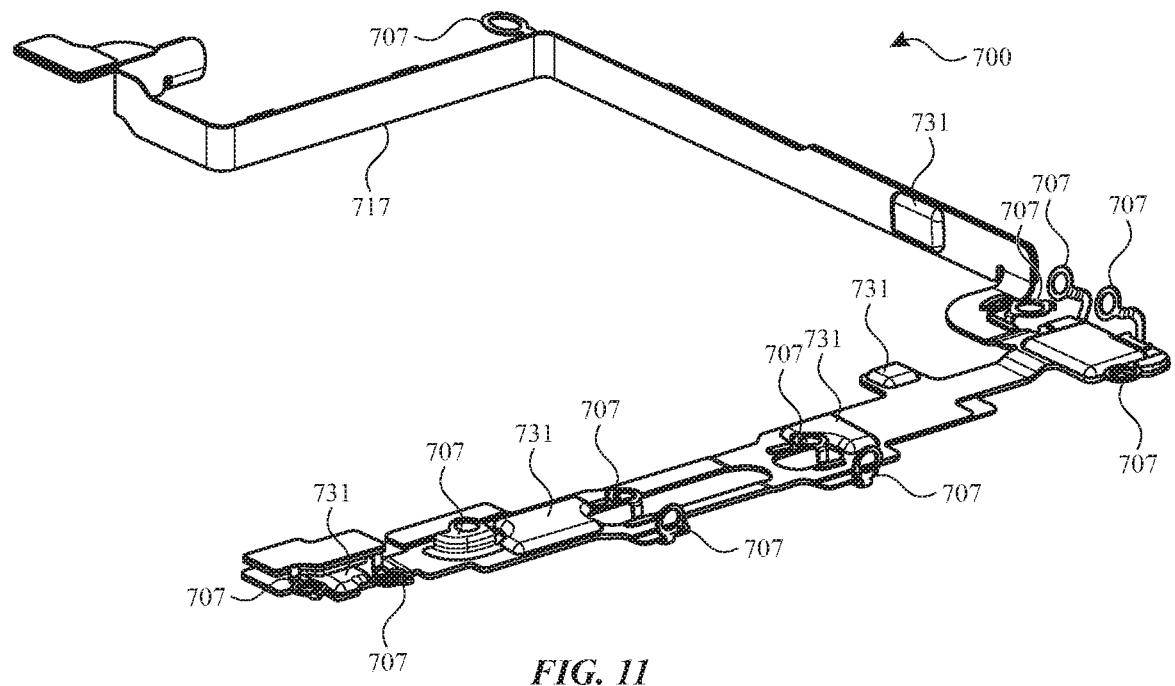
FIG. 11 illustrates an isometric view of an antenna in a folded configuration, according to some embodiments.

FIGS. 10 and 11 show an example of an antenna 700 implemented as a flexible circuit 717. In the example shown in FIGS. 10 and 11, the flexible circuit 717 is configured as a single, continuous flexible circuit. FIG. 10 shows the antenna structure unfolded and in plan view, while FIG. 11 shows the antenna structure as it can be folded when assembled in an electronic device. As shown in FIG. 11, the flexible circuit 717 provided for the antenna 700 can support one or more surface mount technology ("SMT") components 731 and/or clips 707 that can be surface mounted using SMT processes to the flexible circuit. Each of the SMT components 731 can include active and/or passive electronic circuit components, such as, for example, capacitors, resistors, or integrated circuits. Each of the clips 707 can be used to provide a mechanical and/or electrical attachment to the chassis, as described above. The SMT components 731 and/or clips 707 can be mounted or assembled onto the flexible circuit 717 using pick-and-place processes or any other suitable SMT processes.

Figure 12:
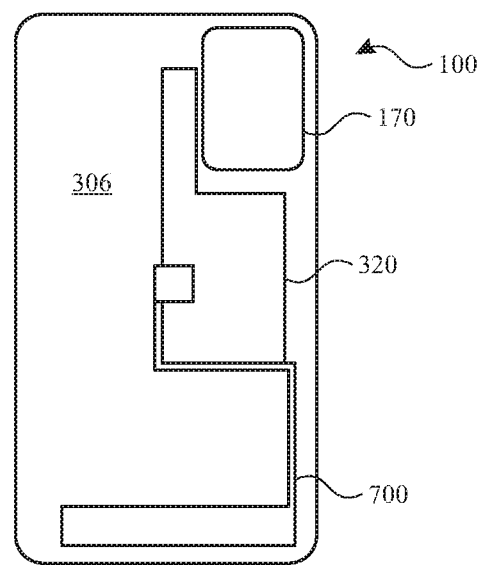
FIG. 12 illustrates a plan view of an electronic device having an antenna, according to some embodiments.

FIG. 12 shows the antenna structure of FIGS. 10 and 11 laid out in the electronic device 100 and mounted to the chassis 306, according to some embodiments. In FIG. 12, the antenna 700 is assembled in the electronic device 100 as a lower antenna (LAT), with the antenna folded along an edge of the circuit board assembly 320, near a bottom edge of the electronic device that is opposite to a top edge that contains camera assembly 170. Other components are omitted for clarity, and it will be appreciated that this is just one example of a layout of components for the electronic device 100.

As seen in the example of FIGS. 10-12, the antenna 700 can be implemented with a series of bends and/or folds to permit assembly and allow for the antenna 700 to transverse between and around components of the electronic device 100. One challenge with using a flexible circuit having an antenna shape that is long or has multiple bends, such as the example shown in FIGS. 10-12, is that the flexible circuit may not readily permit panelization for cost efficient manufacturing. For example, when multiple antennae are manufactured out of a single larger flexible circuit substrate in a panel format, the irregular shape of the antennae may lead to lower yield for a given amount of flexible circuit substrate material.

Figure 13:
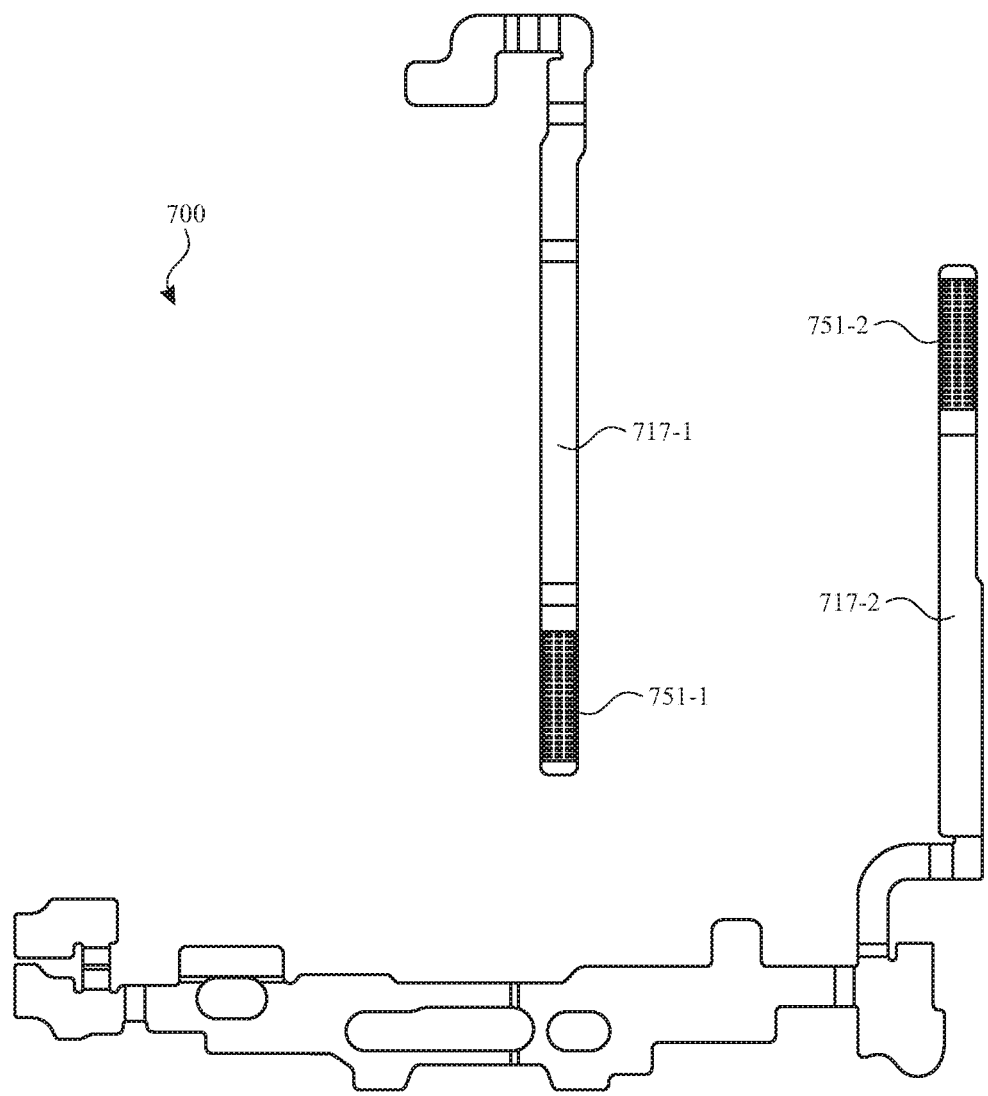
FIG. 13 illustrates a plan view of an antenna assembly in an unassembled and unfolded configuration, according to some embodiments.
Figure 14:
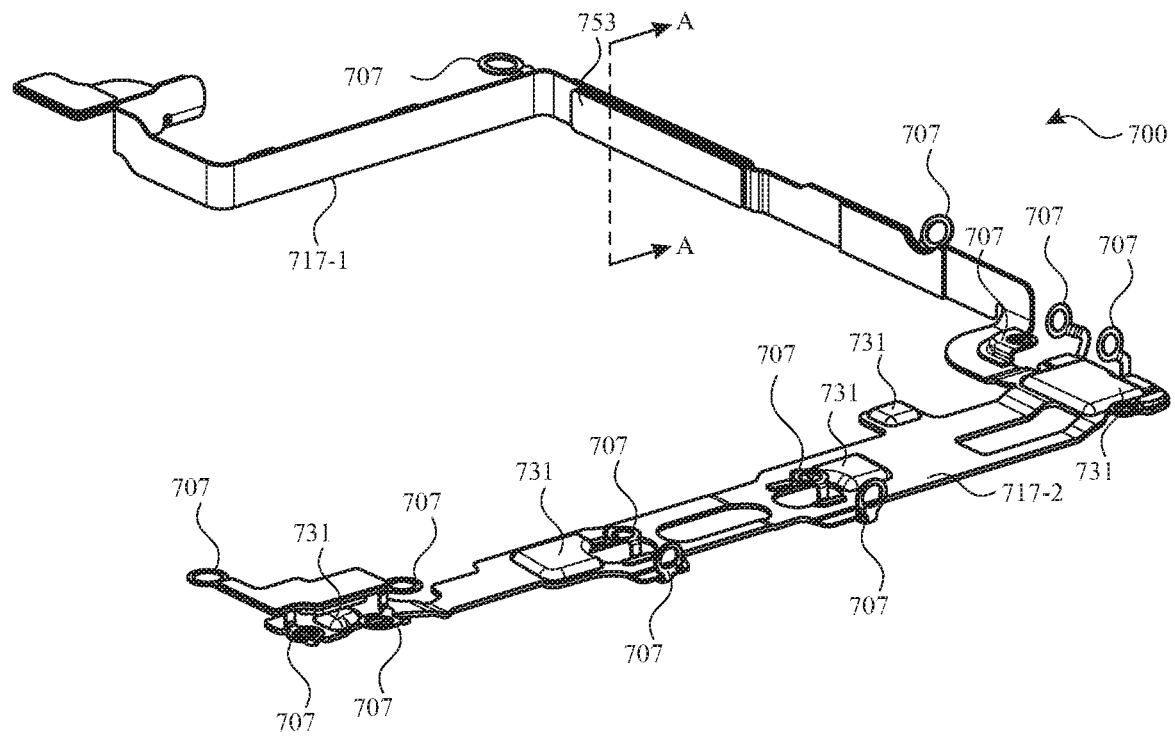
FIG. 14 illustrates an isometric view of an antenna assembly in an assembled and folded configuration, according to some embodiments.

According to some embodiments, for example as shown in FIG. 13-14, an antenna 700 may be made from or provided by multiple discrete flexible circuits attached together. FIGS. 13-14 show an example of antenna 700 in which flexible circuit 717 is made from multiple discrete flexible circuits, including a first flexible circuit 717-1 and a second flexible circuit 717-2. FIG. 13 shows the antenna 700, including first flexible circuit 717-1 and second flexible circuit 717-2, in plan view in an unassembled or detached configuration. FIG. 14 shows the antenna 700, including first flexible circuit 717-1 and second flexible circuit 717-2, in isometric view in an assembled or attached configuration. FIG. 13 also shows the antenna 700 in an unfolded configuration while FIG. 14 shows the antenna 700 in a folded configuration as it can be arranged to facilitate assembly within an electronic device, such as in the layout shown in FIG. 12.

As seen in FIG. 13, each of the discrete flexible circuits can include a respective attachment region for electrical and mechanical attachment to the other flexible circuit. For example, the first flexible circuit 717-1 can include a first attachment region 751-1, and the second flexible circuit 717-2 can include a second attachment region 751-2 that is configured to be bonded or otherwise attached to the first attachment region 751-1. In the example shown, the first attachment region 751-1 is shown positioned at an end of the first flexible circuit 717-1, and the second attachment region 751-2 is shown positioned at an end of the second flexible circuit 717-2. Such an arrangement can allow for efficient use of the area of each flexible circuit in which the ends of the two flexible circuits are attached to each other. However, other arrangements can be suitable and it is contemplated that each attachment region can be located substantially anywhere on the area of its respective flexible circuit. Use of multiple flexible circuits to form an antenna assembly may, for example, reduce cost when manufacturing the antenna 700 by permitting different segments of the antenna 700 to each be manufactured out of a shape that allows for improved panelization or yield.

Figure 15:
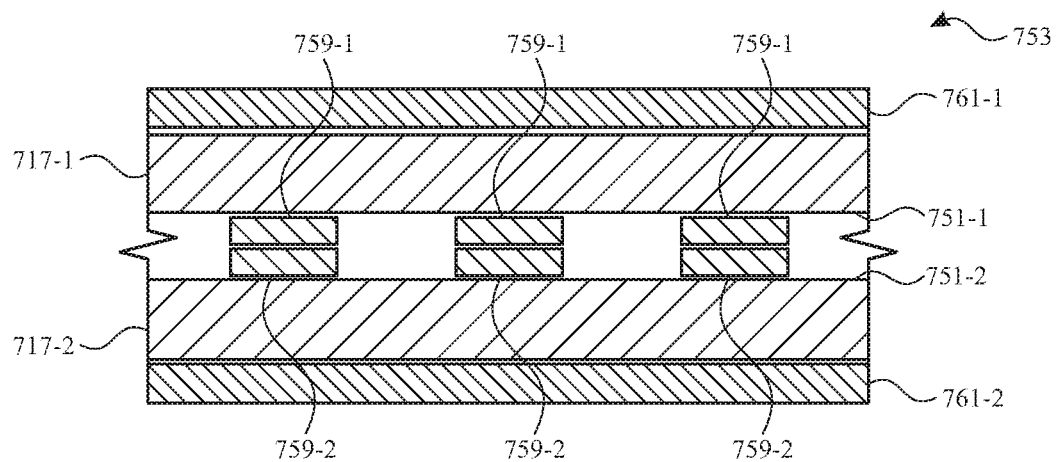
FIG. 15 illustrates a cross section view of a joint in an antenna assembly, according to some embodiments.

FIGS. 14 and 15 show the flexible circuits mechanically and electrically bonded together using a joint 753, such as an SMT joint. FIG. 15 shows a cross section of joint 753 taken across the cross section lines A-A shown in FIG. 14, in which the first attachment region 751-1 and the second attachment region 751-2 can be seen aligned with each other and bonded together.

Referring to FIG. 15, the joint 753 can include one or more stiffeners 761 (e.g., steel plates or other suitable stiffener structures) can be attached to one or more of the flexible circuits to provide for mechanical robustness. For example, as shown in FIG. 15, a first stiffener 761-1 can be attached to the first flexible circuit 717-1, and a second stiffener 761-2 can be attached to the second flexible circuit 717-2. The first stiffener 761-1 and the second stiffener 761-2 can be positioned such that the first and second flexible circuits are positioned between first stiffener 761-1 and second stiffener 761-2 (i.e., the two attachment regions of the two flexible circuits are sandwiched between the two stiffeners).

With continued reference to FIG. 15, each of the attachment regions 751 can further included one or more pads 759 (sometimes referred to herein as "SMT pads") to provide for an electrical interface with the other attached flexible circuit. For example, as shown in FIG. 15, the first attachment region 751-1 of the first flexible circuit 717-1 can include multiple first pads 759-1, and the second attachment region 751-2 of the second flexible circuit 717-2 can include multiple second pads 759-2. Each of the pads 759 is a contact pad that provides an electrically conductive surface configured to electrically and mechanically attach to a corresponding pad of the other flexible circuit, e.g., using solder, conductive adhesives, or the like. For example, the multiple first pads 759-1 can be bonded to and in electrical contact with the multiple second pads 759-2, and the first pads 759-1 can be respectively aligned with the second pads 759-2 so that each of the first pads 759-1 is attached to and in electrical contact with a respective one of the second pads 759-2. Each of the pads 759 is further connected to one or more conductive traces (e.g., signal lines and/or shielding layers not visible in FIG. 15) in the corresponding flexible substrate. For example, each of the first pads 759-1 is internally connected to conductive traces in the first flexible circuit 717-1, and each of the second pads 759-2 is internally connected to conductive traces in the second flexible circuit 717-2.

Figure 16:
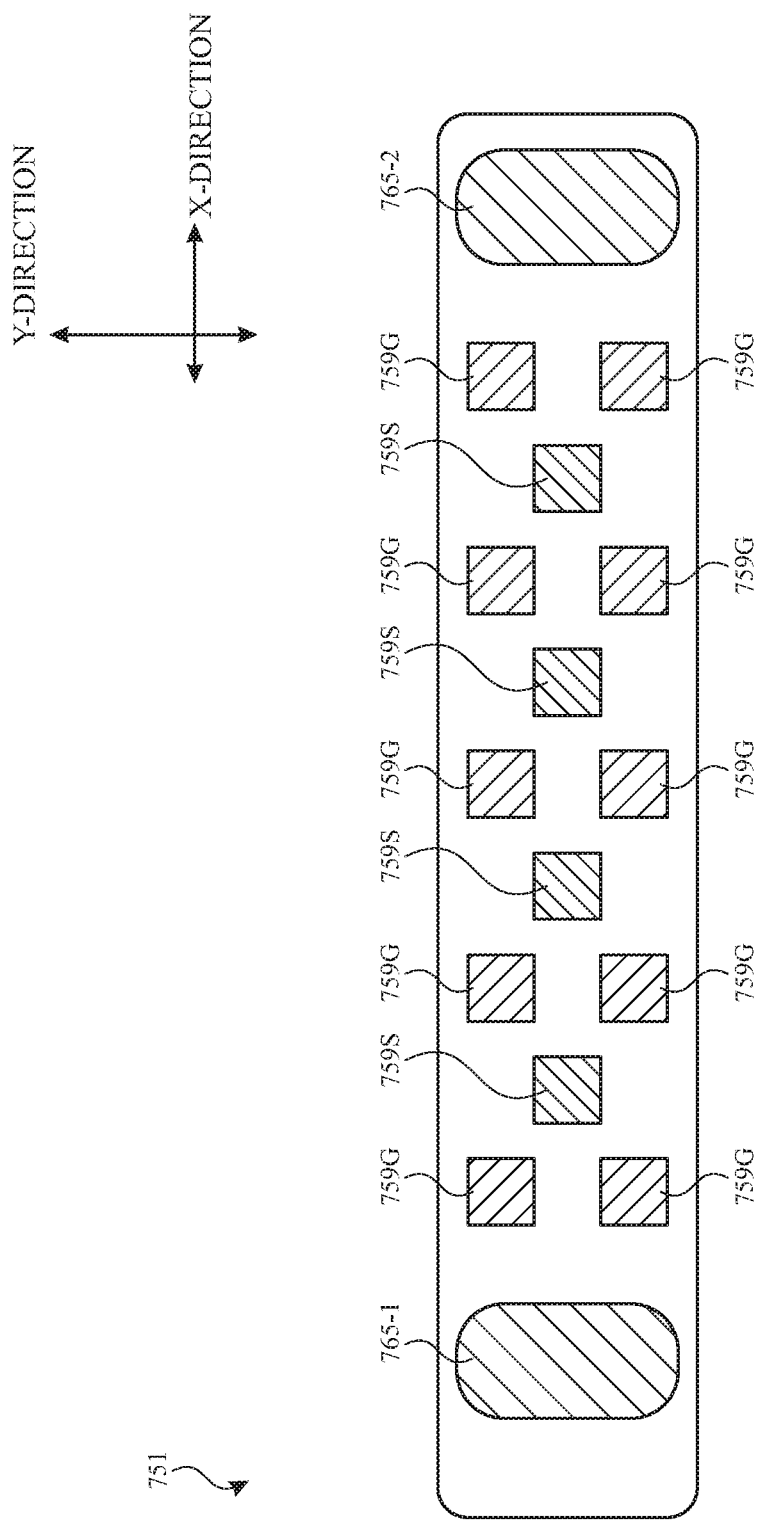
FIG. 16 illustrates a plan view of a pad layout of an antenna assembly, according to some embodiments.

An example of a pad layout that can be used for each of the attachment regions 751 is shown in FIG. 16, according to some embodiments. As seen in FIG. 16, the attachment region 751 of each of the attached flexible circuits 717 (e.g., first attachment region 751-1 and second attachment region 751-2) can include a pad layout having multiple shielding pads 759G and one or more signal pads 759S. Multiple shielding pads 759G can be disposed around each given signal pad 759S to, for example, provide for reduced signal loss or improved signal containment at the joint based on the surrounding shielding pads 759G providing for a shielding effect around each signal pad 759S. For example, in various embodiments, the attachment region 751 can include a pad layout having two, three, four, five, six, seven, eight, or any suitable number of shielding pads 759G disposed in an annular area around each given signal pad 759S. The precise layout, configuration, and number of shielding pads 759G selected can be determined based on considerations such as trace and space requirements of the particular circuit substrate technology.

In FIG. 16, multiple signal pads 759S are shown as a center row of pads in which the row extends in an X-direction along a length of attachment region 751. Each of the signal pads 759S can be connected to a signal line of the corresponding flexible circuit, such as the signal line 729 shown in FIG. 9. Multiple shielding pads 759G are shown in the two rows (top and bottom rows) of pads in FIG. 16. Each of the shielding pads 759G can be connected to a shielding layer or grounding path of the corresponding flexible circuit, such as one or more of the shielding layer(s) 725 and/or shielding vias 727 shown in FIG. 8.

As seen in FIG. 16, the multiple shielding pads 769G are arranged such that, for each of the signal pads 759S, there are multiple shielding pads disposed in an area around the signal pad. In the illustrated example, there are four of the shielding pads 759G disposed around each of the signal pads 759S. As shown for example in FIG. 16, a pair of shielding pads can be disposed on opposite sides of a given signal pad to provide for shielding around the signal pad.

The example layout of FIG. 16 further includes features that can provide signal containment at the joint while balancing constraints such as manufacturing spacing tolerances and size of the flexible circuit area. For example, in FIG. 16 the pads are laid out a staggered arrangement in which the signal pads 759S are disposed in a row that is staggered relative to the rows of shielding pads 759G. An X-Y frame of reference is shown in FIG. 16 for purposes of explanation. The X-Y frame of reference can be any arbitrary frame of reference, or, in some embodiments, the X-direction can correspond to a longitudinal direction along a length of a segment of the flexible circuit, where the attachment region is longer in the longitudinal direction than a perpendicular lateral direction and the segment of the flexible circuit runs in the longitudinal direction.

As illustrated, the top and bottom rows of shielding pads 759G can be aligned with each other in an X-direction so that the X-position of each of the shielding pads 759G in the top row substantially matches the X-position of another one of the shielding pads 759G in the bottom row. However, the signal pads 759S in the center row are staggered, or offset in the X-direction, relative to the top and bottom rows of shielding pads 759G, so that the X-position of each of the signal pads 759S does not match the X-position of any of the shielding pads 759G in the top and bottom rows. This can permit reduced width of the flexible circuit in the Y-direction, or for a fixed width can permit increased size of the signal pad, without unduly increasing signal loss compared to an arrangement in which the three rows of pads are aligned with each other and not staggered relative to each other. However, while the staggered arrangement can be advantageous, it is contemplated that other embodiments can utilize other feasible arrangements, such as an aligned arrangement between the signal pads 759S and shielding pads 759G.

FIG. 16 also shows an example of the attachment region 751 in which an adhesive, such as a temperature activated adhesive, is used to enhance mechanical robustness in the joint between the attached flexible circuits. In the layout shown in FIG. 16, a first temperature activated adhesive attachment 765-1 is included on one side of the pad layout, while another temperature activated adhesive attachment 765-2 is included on an opposite side of the pad layout, such that all the signal pads 759S and 759G are positioned between the first and second temperature activated adhesive attachments. Although a particular arrangement in which the pads are positioned between temperature activated adhesives are shown, it is contemplated that other arrangements and positioning of the pads relative to the adhesives can be used in various embodiments.

Figure 17:
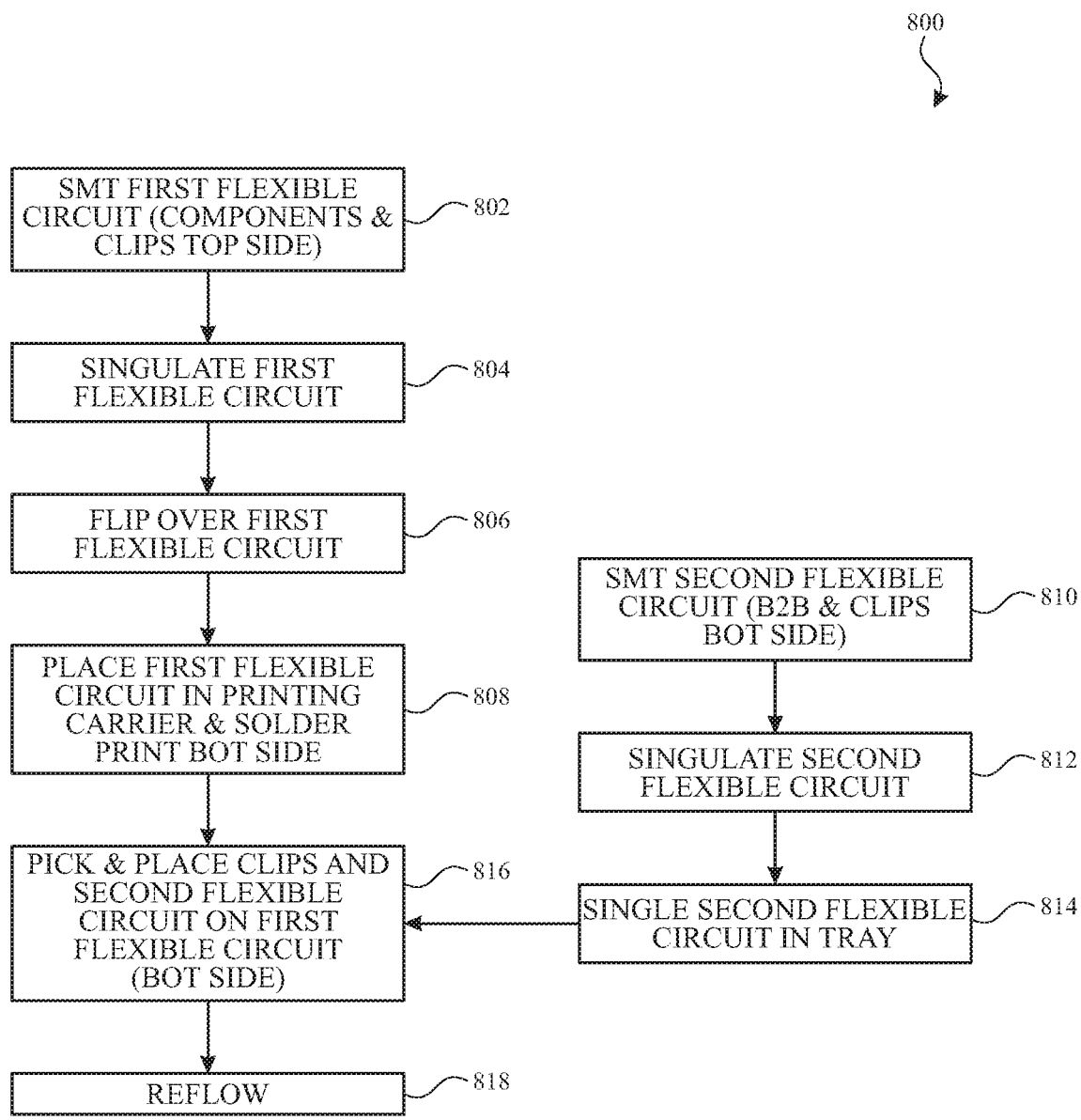
FIG. 17 illustrates a process flow of a method of making an antenna assembly, according to some embodiments.
Figure 18:
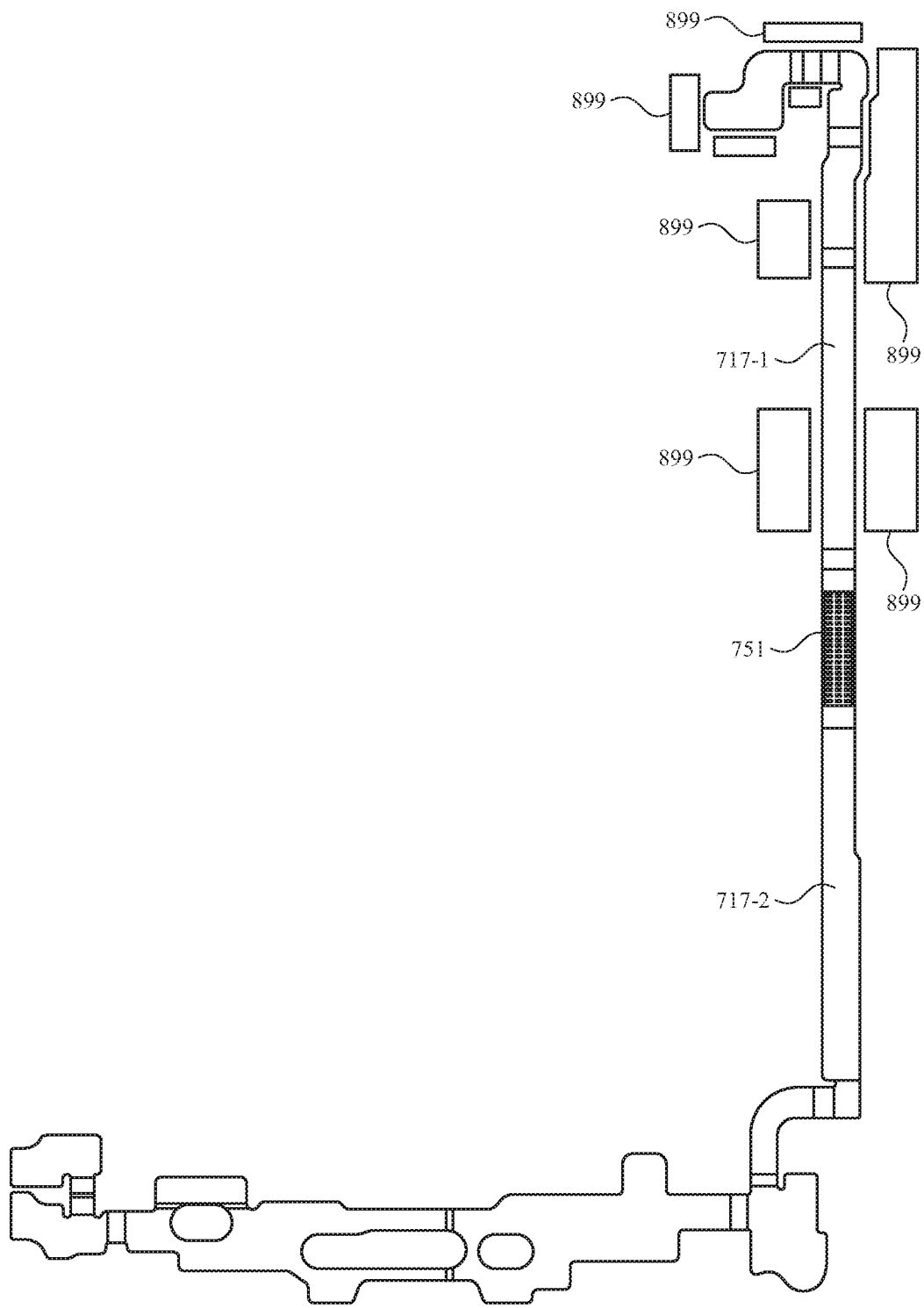
FIG. 18 illustrates a plan view of an antenna assembly during a method of making the antenna assembly, according to some embodiments.

FIG. 17 illustrates a flow chart showing an example of a method 800 for making or assembling a flexible circuit assembly, like those shown in FIGS. 13-16 for the antenna 700, according to some embodiments. FIG. 18 shows an example of the flexible circuit assembly during the method 800 of making the flexible circuit assembly, according to some embodiments.

As shown for example in FIG. 17, an SMT assembly process flow may be used for attaching the multiple flexible circuits together where a classic flex hotbar technology is not suitable. Each of the flexible circuits in the assembly, such as the first flexible circuit 717-1 and the second flexible circuit 717-2, may be manufactured out of a panel format substrate. In some embodiments, the first flexible circuit 717-1 and/or the second flexible circuit 717-2 may be formed from a 5 layer substrate. Alternatively, other multilayer substrates or multilayer constructions can be used to allow for the formation of signal lines and shielding in different layers of the flexible circuits.

As shown in FIG. 17, SMT components and clips may be mounted to the first flexible circuit and the second flexible circuit separately. The SMT components may be mounted or attached before singulation and while each flexible circuit is still in a panel format. For example, multiple first flexible circuits can be included on a common panel format substrate, and SMT components can be mounted to the multiple first flexible circuits. Separately, on a different panel format substrate area, SMT components can be mounted to multiple second flexible circuits while the multiple second flexible circuits are still in a panel format.

As further shown in FIG. 17, each of the first flexible circuit and the second flexible circuit may be singulated from their larger panel format to provide for an individual first flexible circuit and second flexible circuit, respectively. The singulated first flexible circuit can then be flipped and placed in a printing carrier. A pick and place process, for example, can be used to place the second flexible circuit onto the first flexible circuit, as well as, for example, additional components such as additional clips. After placement of the second flexible circuit on the first flexible circuit, a reflow process can be used to form a mechanical and electrical bond between the pads of the first and second attachment regions.

Referring to FIG. 17 in more detail, at 802, SMT components and/or clips are attached to a first side (e.g., top side) of the first flexible circuit. At 804, the first flexible circuit is singulated. This can be accomplished after attachment of the components and clips to the first flexible circuits, using dicing, sawing, laser-cutting, or the like, to separate the multiple first flexible circuits from each other out of the panel format substrate. At 806, the first flexible circuit is flipped over to expose a second side opposite the first side (e.g., the bottom side). At 808, the first flexible circuit is placed in a printing carrier, and the second side is solder printed.

Separately or in parallel to steps 802, 804, 806, and 808, the second flexible circuit can be manufactured out of a different panel format substrate area. At 810, SMT components and/or clips are attached to a first side (e.g., bottom side) of the second flexible circuit. At 812, the second flexible circuit is singulated. This can be accomplished using any of the singulation techniques described above. At 814, the second flexible circuit is placed in a tray.

After the steps described above, at 816, the second flexible circuit is attached to the first flexible circuit. For example, the second flexible circuit can be attached to the second side (e.g., bottom side) first flexible circuit using a pick and place process, together with clips that can be placed on the second side (e.g., bottom side) of the first flexible circuit. At step 818, a reflow process is performed to establish electrical and mechanical attachment for components, such as between the contact pads of the attachment regions on each of the first and second flexible circuits.

FIG. 18 shows an example of the first flexible circuit 717-1 and second flexible circuit 717-2 during a method of making the flexible circuit assembly, e.g., during the attachment step 816 described above. As shown for example in FIG. 18, one or more fixture guides 899 can be used around the first flexible circuit 717-1 to retain the first flexible circuit 717-1 in place during the assembly process flow, while the second flexible circuit 717-2 can be attached to and/or placed on the first flexible circuit 717-1, e.g., using a pick and place tool. It is also contemplated that these arrangements can be flipped so that the second flexible circuit shown in the figures remains fixed while the first flexible circuit is placed on top of the second flexible circuit.

A reference to an element in the singular is not intended to mean one and only one unless specifically so stated, but rather one or more. For example, "a" module may refer to one or more modules. An element proceeded by "a," "an," "the," or "said" does not, without further constraints, preclude the existence of additional same elements.

Headings and subheadings, if any, are used for convenience only and do not limit the invention. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" or "at least one of A, B, or C" refers to only A, only B, or only C; any combination of A, B, and C; and/or at least one of each of A, B, and C.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order. It should be understood that the described instructions, operations, and systems can generally be integrated together in a single software/hardware product or packaged into multiple software/hardware products.

In one aspect, a term coupled or the like may refer to being directly coupled. In another aspect, a term coupled or the like may refer to being indirectly coupled.

Terms such as top, bottom, front, rear, side, horizontal, vertical, and the like refer to an arbitrary frame of reference, rather than to the ordinary gravitational frame of reference. Thus, such a term may extend upwardly, downwardly, diagonally, or horizontally in a gravitational frame of reference.

The disclosure is provided to enable any person skilled in the art to practice the various aspects described herein. In some instances, well-known structures and magnets are shown in block diagram form in order to avoid obscuring the concepts of the subject technology. The disclosure provides various examples of the subject technology, and the subject technology is not limited to these examples. Various modifications to these aspects will be readily apparent to those skilled in the art, and the principles described herein may be applied to other aspects.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph or 35 U.S.C. § 112(f), unless the element is expressly recited using the phrase "means for" or, in the case of a method claim, the element is recited using the phrase "step for".

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. An antenna assembly comprising:
a first flexible circuit having a first signal line, at least one first shielding layer, and a first attachment region, wherein the first attachment region includes a first signal pad and first shielding pads disposed around the first signal pad; and
a second flexible circuit having a second signal line, at least one second shielding layer, and a second attachment region, the second attachment region including a second signal pad and second shielding pads disposed around the second signal pad,
wherein the first attachment region is attached to the second attachment region.

2. The antenna assembly of claim 1, wherein:
the first shielding pads comprise a first row of shielding pads and a second row of shielding pads; and
the first signal pad is part of a row of signal pads positioned between the first and second rows of shielding pads.

3. The antenna assembly of claim 2, wherein the row of signal pads is staggered relative to the first and second rows of shielding pads.

4. The antenna assembly of claim 1, wherein:
the first signal pad is electrically and mechanically bonded to the second signal pad; and
each of the first shielding pads is electrically and mechanically bonded to one of the second shielding pads.

5. The antenna assembly of claim 1, wherein:
the first signal pad is connected to the first signal line through the first flexible circuit;
the first shielding pads are connected to the at least one first shielding layer through the first flexible circuit;
the second signal pad is connected to the second signal line through the second flexible circuit; and the second shielding pads are connected to the at least one second shielding layer through the second flexible circuit.

6. The antenna assembly of claim 1, further comprising:
a first stiffener attached to the first flexible circuit; and
a second stiffener attached to the second flexible circuit, wherein the first and second attachment regions are positioned between the first and second stiffeners.

7. The antenna assembly of claim 1, wherein:
the first attachment region further comprises a first temperature activated adhesive; and
the second attachment region further comprises a second temperature activated adhesive adhered to the first temperature activated adhesive.

8. The antenna assembly of claim 1, wherein each of the first shielding pads and the second shielding pads are electrically connected to a grounding path of a chassis of an electronic device.

9. The antenna assembly of claim 1, further comprising surface mount components and clips attached to at least one of the first flexible circuit or the second flexible circuit.

10. A flexible circuit for an antenna, the flexible circuit comprising:
a conductive signal line;
a conductive shielding layer overlapping the conductive signal line;
a dielectric layer between the conductive signal line and the conductive shielding layer;
two rows of conductive shielding pads electrically connected to the conductive shielding layer; and
a row of conductive signal pads electrically connected to the conductive signal line, wherein the row of conductive signal pads is staggered relative to the two rows of conductive shielding pads and the row of conductive signal pads is positioned between the two rows of conductive shielding pads.

11. The flexible circuit of claim 10, further comprising two temperature activated attachments, wherein the two rows of conductive shielding pads and the row of conductive shielding pads are positioned between the two temperature activated attachments.

12. The flexible circuit of claim 10, wherein the conductive shielding layer is a first conductive shielding layer and the dielectric layer is a first dielectric layer, wherein the flexible circuit further comprises:
a second conductive shielding layer overlapping the conductive signal line; and
a second dielectric layer between the conductive signal line and the second conductive shielding layer.

13. The flexible circuit of claim 10, further comprising:
two rows of shielding vias, wherein the conductive signal line is disposed between the two rows of shielding vias.

14. The flexible circuit of claim 10, wherein the dielectric layer is made from a liquid crystal polymer.

15. The flexible circuit of claim 10, wherein:
the two rows of conductive shielding pads extend in a first direction and are aligned with each other, such that a position along the first direction of each of the conductive shielding pads in one of the two rows substantially matches a position along the first direction of another conductive shielding pad in the other of the two rows; and
the row of conductive signal pads extends in the first direction and is offset from the two rows of conductive shielding pads in the first direction, such that a position along the first direction of each of the conductive shielding pads does not match a position along the first direction of any of the conductive shielding pads in the two rows of conductive shielding pads.

16. An electronic device comprising:
a chassis having a grounding path;
electronic components mounted to the chassis; and
an antenna assembly mounted to the chassis between two or more of the electronic components, wherein the antenna assembly comprises two flexible circuits attached to each other via a joint, wherein the joint comprises two signal pads bonded to each other and two sets of shielding pads bonded to each other, wherein the two sets of shielding pads are disposed around the two signal pads and are electrically connected to the grounding path of the chassis through at least one of the two flexible circuits.

17. The electronic device of claim 16, wherein the two signal pads connect two respective signal lines in the two flexible circuits to each other, wherein the two respective signal lines are configured to carry a radiofrequency signal.

18. The electronic device of claim 17, wherein the two sets of shielding pads connect two respective shielding layers in the two flexible circuits to each other, wherein the two respective shielding layers are configured to shield the radiofrequency signal.

19. The electronic device of claim 16, wherein the antenna assembly comprises clips attached to the chassis, wherein the clips electrically connect the two sets of shielding pads to the grounding path of the chassis.

20. The electronic device of claim 16, wherein the two signal pads are staggered relative to the two sets of shielding pads.

* * * * *